(12) United States Patent
Miao et al.

(10) Patent No.: US 10,332,962 B2
(45) Date of Patent: Jun. 25, 2019

(54) NANOSHEET SEMICONDUCTOR STRUCTURE WITH INNER SPACER FORMED BY OXIDATION

(71) Applicant: International Business Machines Corporation, Armonk, NY (US)

(72) Inventors: Xin Miao, Guilderland, NY (US); Kangguo Cheng, Schenectady, NY (US); Chen Zhang, Albany, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/730,306

(22) Filed: Oct. 11, 2017

(65) Prior Publication Data

US 2019/0109191 A1  Apr. 11, 2019

(51) Int. Cl.
*H01L 21/02* (2006.01)
*H01L 29/06* (2006.01)
(Continued)

(52) U.S. Cl.
CPC .... *H01L 29/0673* (2013.01); *H01L 21/02587* (2013.01); *H01L 29/1033* (2013.01); *H01L 29/4232* (2013.01); *H01L 29/66522* (2013.01)

(58) Field of Classification Search
CPC .......... H01L 29/66545; H01L 29/0847; H01L 29/7827; H01L 29/66795; H01L 29/66666; H01L 29/785; H01L 29/6656; H01L 21/823431; H01L 29/42392; H01L 29/0649; H01L 29/6653; H01L 29/66553; H01L 27/0886; H01L 29/165; H01L 29/401; H01L 29/7851; H01L 21/02532; H01L 21/30604; H01L 29/7848; H01L 21/823481; H01L 29/0673; H01L 21/02164; H01L 29/0653; H01L 29/161; H01L 29/66742; B60L 2240/423;
(Continued)

(56) References Cited

U.S. PATENT DOCUMENTS 8,785,909 B2   7/2014   Radosavljevic et al.
8,890,264 B2   11/2014  Dewey et al.
(Continued)

FOREIGN PATENT DOCUMENTS

GB   2544190 A    5/2017
WO   2016209285 A1   12/2016

OTHER PUBLICATIONS

K.D. Choquette et al., "Advances in Selective Wet Oxidation of AlGaAs Alloys," IEEE Journal of Selected Topics in Quantum Electronics, Jun. 1997, pp. 916-926, vol. 3, No. 3.

*Primary Examiner* — Robert G Bachner
(74) *Attorney, Agent, or Firm* — L. Jeffrey Kelly; Ryan, Mason & Lewis, LLP

(57) ABSTRACT

A method for fabricating a semiconductor structure includes forming a nanosheet stack on a base. The nanosheet stack comprises one or more first nanosheet layers each comprised of a first material and one or more second nanosheet layers each comprised of a second material different from the first material. The nanosheet stack is recessed. Inner spacers comprising a third material are formed. Forming the inner spacers includes converting the first material corresponding to outer portions of each of the one or more first nanosheet layers into the third material.

20 Claims, 5 Drawing Sheets

(51) Int. Cl.
  *H01L 29/66* (2006.01)
  *H01L 29/423* (2006.01)
  *H01L 29/10* (2006.01)

(58) Field of Classification Search
  CPC ........... B60L 2240/16; B60L 2240/486; B60L 2240/80; B60L 7/18; B60T 2201/02; B60T 7/12; B60T 2230/04; B60T 2270/60; B60T 7/122; B60T 8/172; B60T 8/72; B60W 20/00; B60W 10/08; B60W 2520/10; B60W 2710/083; B60W 2710/244; G01S 17/89; G01S 7/4804; G01S 17/48; G06K 2009/2045; G06K 9/00664; G06K 9/20; G06K 9/6202; G06T 2207/10028; G06T 7/13; G06T 7/593; G06T 7/0002; G06T 7/136; G06T 7/30; G06T 7/344; G06T 7/571
  See application file for complete search history.

(56) References Cited

U.S. PATENT DOCUMENTS

| | | |
|---|---|---|
| 8,900,959 B2 | 12/2014 | Chang et al. |
| 9,224,809 B2 | 12/2015 | Li et al. |
| 9,583,491 B2 | 2/2017 | Kim et al. |
| 9,735,258 B2 | 8/2017 | Balakrishnan et al. |
| 2014/0084239 A1 | 3/2014 | Radosavljevic et al. |
| 2014/0084387 A1 | 3/2014 | Dewey et al. |
| 2014/0264276 A1* | 9/2014 | Chang ............... H01L 29/66439 257/24 |
| 2014/0353574 A1 | 12/2014 | Li et al. |
| 2016/0086951 A1 | 3/2016 | Kim et al. |
| 2017/0154973 A1 | 6/2017 | Ching et al. |
| 2017/0179251 A1 | 6/2017 | Balakrishnan et al. |
| 2018/0090624 A1* | 3/2018 | Cheng ............... H01L 29/78696 |

* cited by examiner

100

100

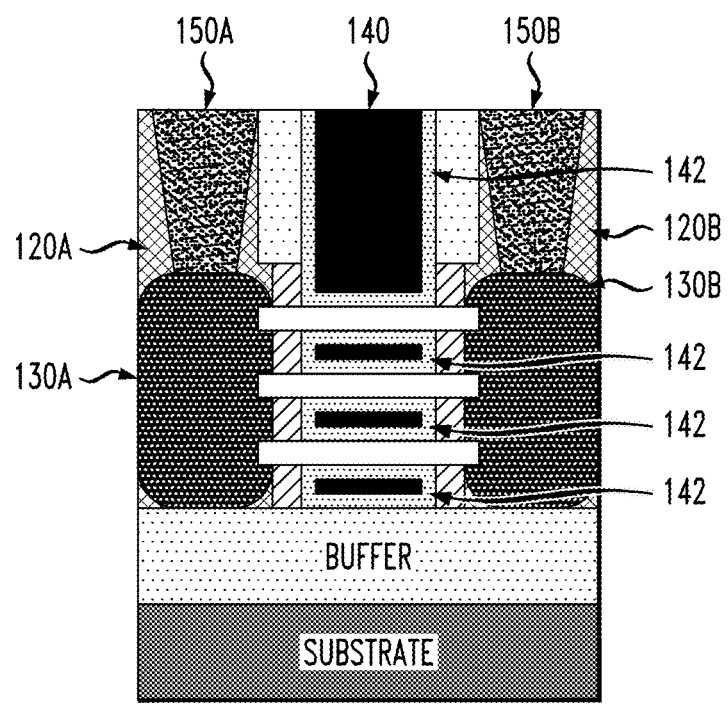

NANOSHEET SEMICONDUCTOR STRUCTURE WITH INNER SPACER FORMED BY OXIDATION

BACKGROUND

Continued innovations in semiconductor process technologies are enabling higher integration densities and device scaling. As the semiconductor industry moves towards the 7 nanometer (nm) technology node and beyond, planar and non-planar semiconductor device structures, such as field-effect transistors (FETs) (e.g., metal-oxide-semiconductor FETs (MOSFETs)), must be scaled to smaller dimensions to provide increased device width per footprint area. In this regard, nanosheet (or nanowire) FET devices are considered to be a viable option for continued scaling. In general, a nanosheet FET device comprises a device channel having a nanosheet stack comprising one or more nanosheet layers, with each nanosheet layer having a vertical thickness that is substantially less than the width of the nanosheet layer. A common gate structure may be formed above and below each nanosheet layer in a stacked configuration, thereby increasing the FET device width (or channel width). Accordingly, such nanosheet FET devices may increase the drive current for a given footprint area.

SUMMARY

Illustrative embodiments of the invention provide techniques for fabricating semiconductor structures.

For example, in one embodiment, a method for fabricating a semiconductor structure comprises forming a nanosheet stack on a base. The nanosheet stack comprises one or more first nanosheet layers each comprised of a first material and one or more second nanosheet layers each comprised of a second material different from the first material. The nanosheet stack is recessed. Inner spacers comprising a third material are formed. Forming the inner spacers comprises converting the first material corresponding to outer portions of each of the one or more first nanosheet layers into the third material.

While illustrative embodiments are described herein with respect to hybrid channel nanosheet FETs, alternative embodiments may be implemented with other types of semiconductor structures.

BRIEF DESCRIPTION OF THE DRAWINGS

FIG. 1I is a schematic cross-sectional view of a portion of a semiconductor device at a seventh-intermediate fabrication stage, according to an embodiment of the invention.

DETAILED DESCRIPTION

Figure 1A:
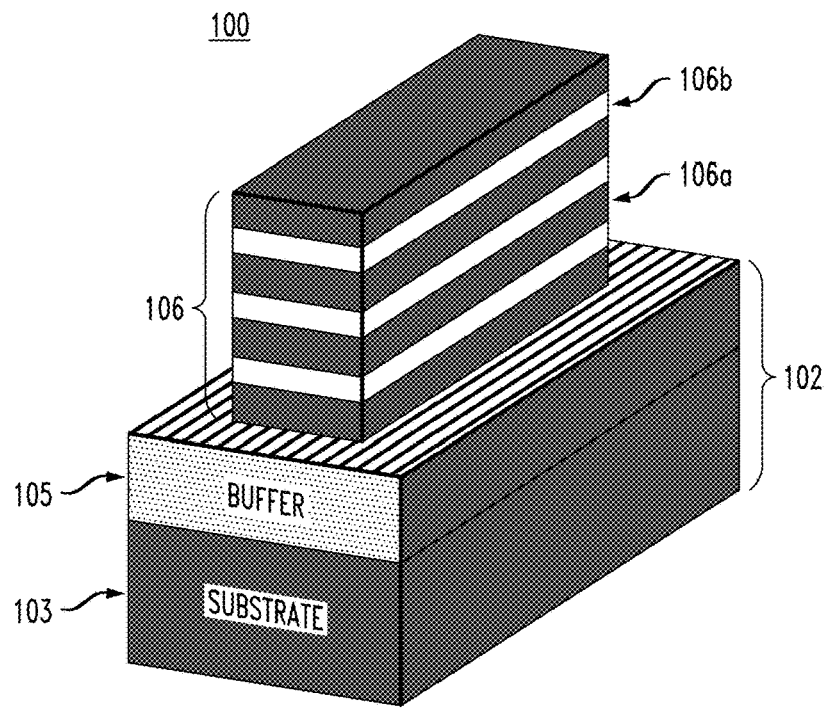
FIG. 1A is a schematic perspective view of a portion of a semiconductor device at a first-intermediate fabrication stage, according to an embodiment of the invention.

In illustrative embodiments, techniques are provided for fabricating semiconductor devices comprised of one or more FETs. More particularly, illustrative embodiments provide techniques for fabricating semiconductor devices comprised of one or more nanosheet FETS (e.g., nanosheet MOSFETS). As will be explained in illustrative embodiments, such fabrication techniques advantageously improve the fabrication of semiconductor devices.

Furthermore, it is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

As used herein, the term "III-V compound" refers to a compound formed by combining one or more group III elements (i.e., one or more elements from the boron group or group 13) with one or more group V elements (i.e., one or more elements from the pnictogen group or group 15).

Inner spacers may be formed during semiconductor structure (e.g., FET) fabrication to provide source/drain (S/D) isolation, and to reduce parasitic capacitances. Conventional methods for forming inner spacers are complex and impose constraints on gate pitch scaling, which also imposes constraints on the maximum space between nanosheets for gate formation. The embodiments described herein provide for fabrication techniques that advantageously form inner spacers for semiconductor structures with less complex processing while substantially limiting the constraints on gate pitch scaling associated with the conventional methods of inner spacer formation.

FIGS. 1A-1I collectively illustrate an exemplary process for fabricating a semiconductor structure for increasing control of fin reveal in a dense fin region. Note that the same reference numeral (100) is used to denote the semiconductor structure through the various intermediate fabrication stages illustrated in FIGS. 1A through 1I. Note also that semiconductor structure described herein can also be considered to be a semiconductor device and/or an integrated circuit, or some part thereof.

Figure 1B:
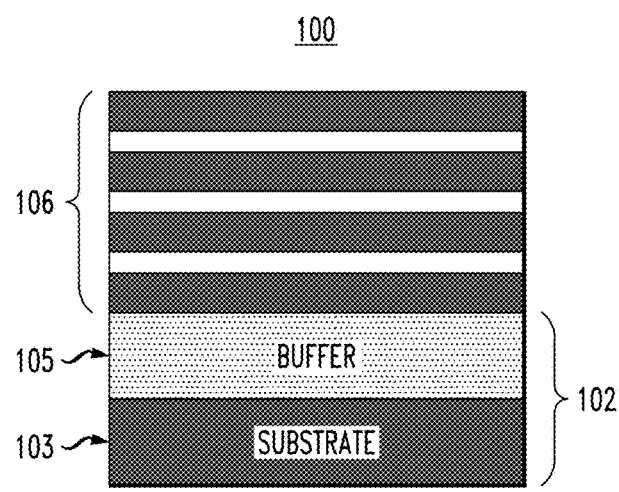
FIG. 1B is a schematic cross-sectional view of a portion of a semiconductor device at a first-intermediate fabrication stage, according to an embodiment of the invention.

FIGS. 1A and 1B illustrate views of a semiconductor structure at a first-intermediate fabrication stage. For the purpose of clarity, several fabrication steps leading up to the production of the semiconductor structure as illustrated in FIGS. 1A and 1B are omitted. In other words, the semiconductor structure does not necessarily start out in the form illustrated in FIGS. 1A and 1B, but may develop into the illustrated structure over one or more well-known processing steps which are not illustrated but are well-known to those of ordinary skill in the art.

FIG. 1A illustrates a perspective view of semiconductor structure 100 at a first-intermediate fabrication stage and FIG. 1B illustrates a cross-sectional view of semiconductor structure 100 at the first-intermediate fabrication stage. Semiconductor structure 100 in FIGS. 1A and 1B is shown comprising nanosheet stack 106 formed on base 102.

Base 102 illustratively comprises buffer 105 formed on substrate 103. In one embodiment, substrate 103 is comprised of silicon (Si). In another embodiment, substrate 103 is comprised of a III-V compound. However, substrate 103 may be comprised of any material suitable for use in accordance with the embodiments described herein. In one embodiment, buffer 105 is comprised of a III-V compound (e.g., alloy). For example, buffer 105 may be comprised of gallium arsenide phosphide ($GaAs_{1-x}P_x$). However, buffer 105 may be comprised of any material suitable for use in accordance with the embodiments described herein.

Nanosheet stack 106 is comprised of alternating nanosheet layers comprising first and second materials. For example, as shown, nanosheet stack 106 comprises layer 106a comprising the first material and layer 106b comprising the second material. Each nanosheet layer of nanosheet stack 106 may have a thickness ranging from about 1 nm to about 100 nm. In one embodiment, at least one of nanosheet layers 106a and 106b is comprised of a III-V compound. For example, the first material may be comprised of aluminum gallium arsenide ($Al_xGa_{1-x}As$). The second material may be comprised of, for example, gallium arsenide (GaAs) or indium gallium arsenide ($In_{1-x}Ga_xAs$). However, the first and second materials may be comprised of any material suitable for use in accordance with the embodiments described herein. Additionally, is to be understood that the arrangement of nanosheet stack 106, including the number of alternating nanosheet layers of nanosheet stack 106, is purely exemplary and should not be considered limiting. Nanosheet stack 106 may be used to form a fin of a resulting nanosheet FET.

Figure 1C:
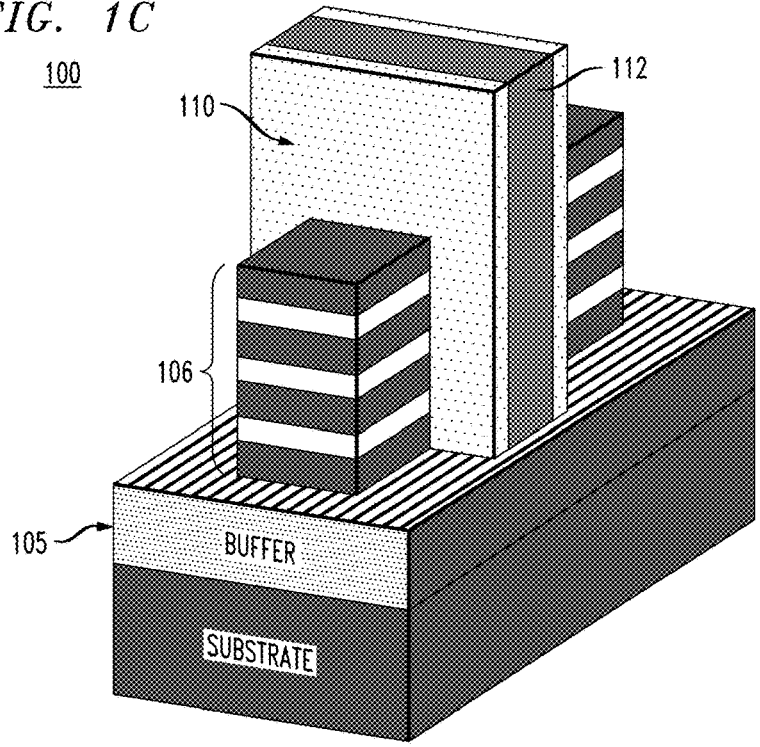
FIG. 1C is a schematic perspective view of a portion of a semiconductor device at a second-intermediate fabrication stage, according to an embodiment of the invention.
Figure 1D:
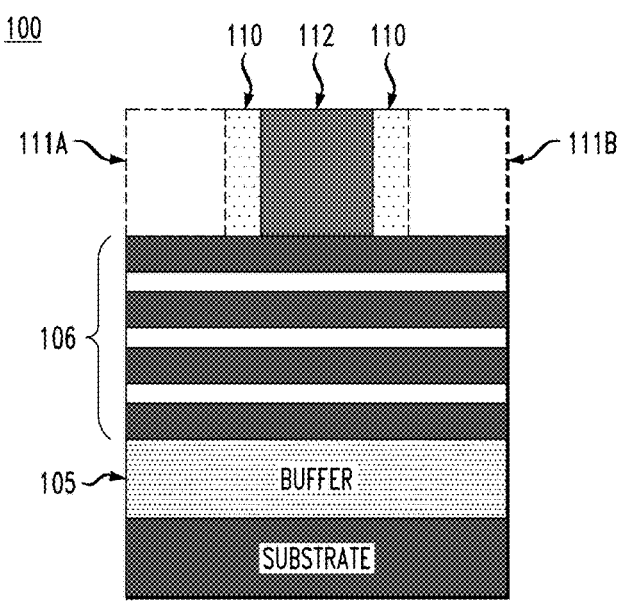
FIG. 1D is a schematic cross-sectional view of a portion of a semiconductor device at a second-intermediate fabrication stage, according to an embodiment of the invention.

FIG. 1C illustrates a perspective view of semiconductor structure 100 at a second-intermediate fabrication stage and FIG. 1D illustrates a cross-sectional view of semiconductor structure 100 at the second-intermediate fabrication stage. During this stage, cladding spacer 110 and dummy gate 112 are formed around nanosheet stack 106 and on buffer 105. As can be further seen in FIG. 1C, the regions of empty space defined by nanosheet stack 106 and cladding spacer 110 are denoted as space 111A and space 111B.

For the sake of simplicity, the remaining fabrication stages will be depicted in the following Figures as cross-sectional views.

Figure 1E:
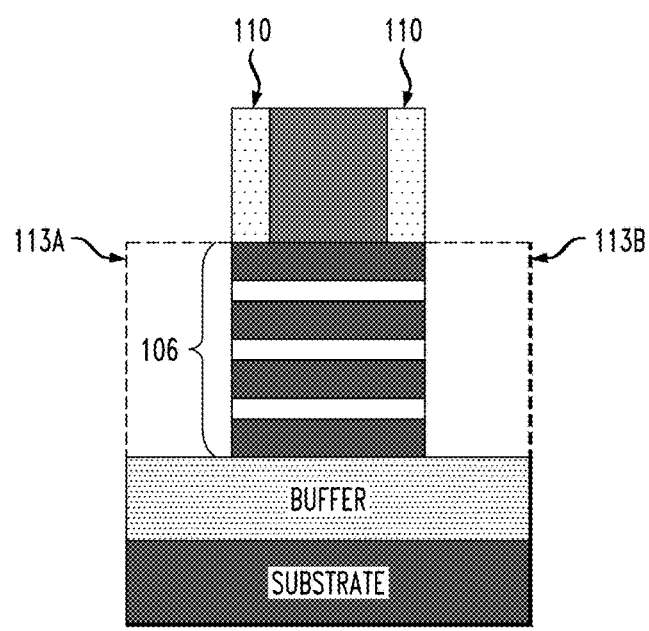
FIG. 1E is a schematic cross-sectional view of a portion of a semiconductor device at a third-intermediate fabrication stage, according to an embodiment of the invention.

FIG. 1E illustrates semiconductor structure 100 at a third-intermediate fabrication stage. During this stage, space 113A and space 113B are formed by recessing nanosheet stack 106. As shown, nanosheet stack 106 is recessed to the exposed edges of cladding spacer 110. In one embodiment, nanosheet stack 106 is recessed to form spaces 113A and 113B using a dry etching process. For example, nanosheet stack 106 may be recessed using reactive ion etching (RIE). However nanosheet stack 106 may be recessed using any process suitable for use in accordance with the embodiments described herein.

Figure 1F:
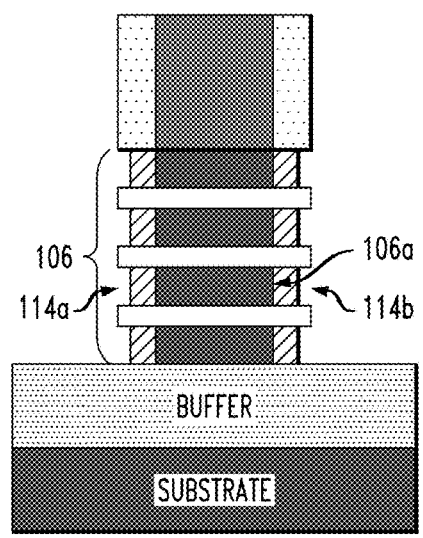
FIG. 1F is a schematic cross-sectional view of a portion of a semiconductor device at a fourth-intermediate fabrication stage, according to an embodiment of the invention.

FIG. 1F illustrates semiconductor structure 100 at a fourth-intermediate fabrication stage. During this stage, outer portions of each nanosheet layer of nanosheet stack 106 that comprise the first material are converted into inner spacers each comprising a third material. For example, as shown, the outer portions of nanosheet layer 106a are converted into inner spacers 114a and 114b. In one embodiment, the conversion is performed by selectively oxidizing the first material within each corresponding nanosheet layer, such as by utilizing low-temperature oxidation. For example, the selective oxidation may be performed utilizing water vapor oxidation at a temperature of around 350 degrees Celsius. In the embodiment in which the first material comprises aluminum gallium arsenide, the third material of the inner spacer comprises aluminum oxide ($Al_2O_3$).

In some embodiments, the lateral thickness of the inner spacers (e.g., inner spacers 114a and 114b) is less than the lateral thickness of the converted first material of the corresponding nanosheet layers (e.g., nanosheet layer 106a). The reduced thickness results from the volume shrinkage of oxidation of the first material during the conversion. As shown in FIG. 1F, the shrinkage leads to indents in inner spacers 114a and 114b. In other words, the nanosheet layers comprising the second material (e.g., nanosheet layer 106b) extend beyond the inner spacers, or "stick out" of the inner spacers. This is advantageous because these "stick-out" nanosheet layers increase the surface area of seed layers for epitaxially growing source/drain in the subsequent process, resulting in epitaxy source/drain wrapping around these "stick-out" nanosheet layers.

Further details regarding the selective oxidation process of aluminum gallium arsenide are disclosed by, for example, Choquette, Kent D. et al. "Advances in Selective Wet Oxidation of AlGaAs Alloys." *IEEE Journal of Selected Topics in Quantum Electronics.* 3.3 (1997): 916-926, the contents of which are hereby incorporated by reference in their entirety.

Figure 1G:
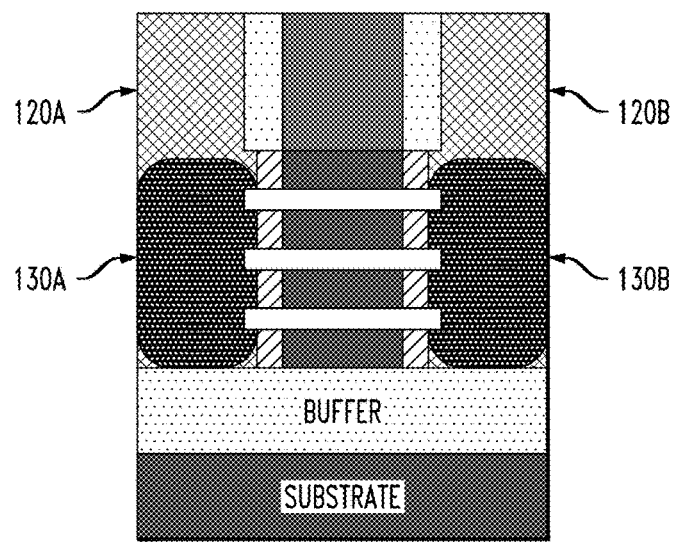
FIG. 1G is a schematic cross-sectional view of a portion of a semiconductor device at a fifth-intermediate fabrication stage, according to an embodiment of the invention.

FIG. 1G illustrates semiconductor structure 100 at a fifth-intermediate fabrication stage. During this stage, interlayer dielectric (ILD) 120A and source/drain region 130A are formed within previously defined spaces 111A and 113A, and ILD 120B and source/drain region 130B are formed within previously defined spaces 111B and 113B. In one embodiment, source/drain regions 130A and 130B are formed by growing respective epitaxial layers. Any method for forming ILDs and source/drain regions may be implemented in accordance with the embodiments described herein.

Figure 1H:
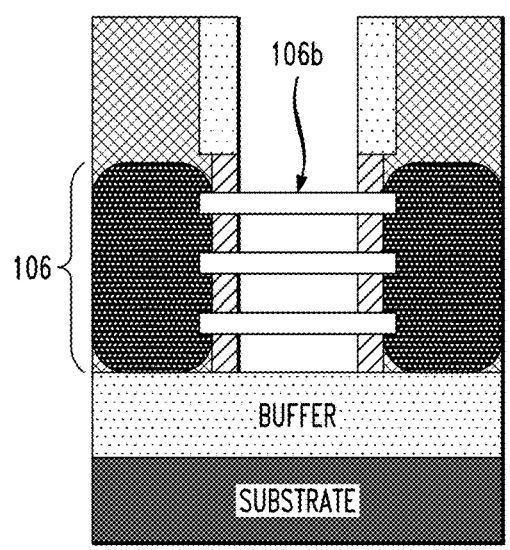
FIG. 1H is a schematic cross-sectional view of a portion of a semiconductor device at a sixth-intermediate fabrication stage, according to an embodiment of the invention.

FIG. 1H illustrates semiconductor structure 100 at a sixth-intermediate fabrication stage. During this stage, dummy gate 112 and the nanosheet layers of nanosheet stack 106 comprising the first material, including nanosheet layer 106A, are selectively removed to release the nanosheet layers of nanosheet stack 106 comprising the second material, including nanosheet layer 106B. In one embodiment, a selective etchant is used to remove the nanosheet layers of nanosheet stack 106 comprising the first material. For example, in the embodiment in which the first material comprises aluminum gallium arsenide, a diluted hydrofluoric acid (HF) may be used as the selective etchant. However, any method of selectively removing the dummy gate and the nanosheet layers of nanosheet stack 106 comprising the first material may be used in accordance with the embodiments described herein.

FIG. 1I illustrates semiconductor structure 100 at a seventh-intermediate fabrication stage. During this stage, replacement metal gate 140 is formed in in the region remaining after the removal of dummy gate 112 and the nanosheet layers of nanosheet stack 106 comprising the first material. Replacement metal gate 140 may be formed via known deposition techniques, such as atomic layer deposition, chemical vapor deposition or physical vapor deposition. Additionally, replacement metal gate 140 may be comprised of work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides).

In some embodiments, gate dielectric layer 142 may be formed around the nanosheet layers prior to forming the replacement metal gate 140. Gate dielectric layer 142 may be formed via known deposition techniques, such as atomic layer deposition, chemical vapor deposition or physical vapor deposition. Additionally, gate dielectric layer 142 may be comprised of silicon dioxide, oxynitride, aluminum oxide, hafnium oxide, zirconium dioxide, lanthanum oxide, or any other appropriate dielectric material. Contacts 150A and 150B are formed within ILDs 120A and 120B, respectively, and in contact with source/drain regions 130A and 130B, respectively.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for fabricating a semiconductor structure, the method comprising:
    forming a nanosheet stack on a base, wherein the nanosheet stack comprises one or more first nanosheet layers each comprised of a first material and one or more second nanosheet layers each comprised of a second material different from the first material;
    recessing the nanosheet stack; and
    forming inner spacers comprising a third material, wherein forming the inner spacers comprises converting the first material corresponding to outer portions of each of the one or more first nanosheet layers into the third material, wherein a length of the one or more second nanosheet layers exceed a length of the inner spacers.

2. The method of claim 1, wherein converting the outer portions of the one or more first nanosheet layers into the inner spacers comprises selectively oxidizing the first material.

3. The method of claim 2, wherein the selective oxidation is performed utilizing low-temperature oxidation.

4. The method of claim 3, wherein the selective oxidation is performed utilizing water vapor oxidation at a temperature of around 350 degrees Celsius.

5. The method of claim 1, wherein the inner spacers have a lateral thickness less than a lateral thickness of the first nanosheet layers, thereby causing the second nanosheet layers to extend beyond the inner spacers.

6. The method of claim 1, wherein at least one of the first material and the second material is comprised of a III-V compound.

7. The method of claim 6, wherein the first material is comprised of aluminum gallium arsenide, and wherein the second material is comprised of one of gallium arsenide and indium gallium arsenide.

8. The method of claim 7, wherein the third material is comprised of aluminum oxide.

9. The method of claim 1, further comprising forming at least one interlayer dielectric and at least one source/drain region after the conversion step.

10. The method of claim 1, further comprising forming a cladding spacer and a dummy gate around the nanosheet stack prior to recessing the nanosheet stack.

11. The method of claim 10, further comprising selectively removing the dummy gate and the one or more first nanosheet layers.

12. The method of claim 11, further comprising forming a replacement metal gate, and forming at least one contact within the at least one interlayer dielectric and in contact with the at least one source/drain region.

13. The method of claim 12, further comprising forming a gate dielectric layer prior to forming the replacement metal gate.

14. The method of claim 1, wherein the nanosheet stack is recessed using a dry etching process.

15. The method of claim 14, wherein the dry etching process used to recess the nanosheet stack is reactive-ion etching.

16. The method of claim 1, wherein the base comprises a substrate and a buffer formed on the substrate.

17. The method of claim 16, wherein the substrate is comprised of silicon, and wherein the buffer is comprised of a III-V compound.

18. The method of claim 17, wherein the III-V compound is gallium arsenide phosphide.

19. The method of claim 1, wherein the first material comprises aluminum gallium arsenide and the third material of the inner spacer comprises aluminum oxide ($Al_2O_3$).

20. The method of claim 9, wherein the at least one source/drain region is epitaxially grown.

* * * * *